United States Patent [19]

Fujita et al.

[11] Patent Number: 5,578,660

[45] Date of Patent: Nov. 26, 1996

[54] EPOXY RESIN COMPOSITION

[75] Inventors: Hiroshi Fujita, Tochigi-ken; Naoki Mogi, Utsunomiya; Shigehisa Ueda, Utsunomiya; Takashi Aihara, Utsunomiya, all of Japan

[73] Assignee: Sumitomo Bakelite Company Limited, Tokyo, Japan

[21] Appl. No.: 287,592

[22] Filed: Aug. 8, 1994

Related U.S. Application Data

[63] Continuation of Ser. No. 67,611, May 27, 1993, abandoned.

[30] Foreign Application Priority Data

| Sep. 21, 1992 | [JP] | Japan | 4-250947 |
| Sep. 21, 1992 | [JP] | Japan | 4-250949 |
| Sep. 25, 1992 | [JP] | Japan | 4-256005 |
| Sep. 25, 1992 | [JP] | Japan | 4-256006 |
| Dec. 18, 1992 | [JP] | Japan | 4-338984 |
| Feb. 26, 1993 | [JP] | Japan | 5-037929 |

[51] Int. Cl.⁶ ............................. C08L 63/00; C08L 63/02
[52] U.S. Cl. ................... 523/443; 523/466; 525/481; 525/482; 528/97; 528/98
[58] Field of Search .................... 523/443, 466; 525/481, 482; 528/97, 98

[56] References Cited

U.S. PATENT DOCUMENTS

| 2,499,370 | 3/1950 | De Groote et al. | 252/331 |
| 2,828,283 | 3/1958 | De Groote et al. | 260/53 |
| 2,837,493 | 6/1958 | Schlenker et al. | 260/33.4 |
| 4,153,621 | 5/1979 | Hartmann | 549/560 |
| 4,868,059 | 9/1989 | Walker et al. | 525/482 |
| 5,141,974 | 8/1992 | Konishi et al. | 525/481 |
| 5,149,730 | 9/1992 | Murata et al. | 525/481 |

FOREIGN PATENT DOCUMENTS

| 0450944 | 10/1991 | European Pat. Off. . |
| 0524433 | 1/1993 | European Pat. Off. . |
| 0536748 | 4/1993 | European Pat. Off. . |
| 62-167318 | 7/1987 | Japan . |
| 63-251419 | 10/1988 | Japan . |
| 64-65116 | 3/1989 | Japan . |

OTHER PUBLICATIONS

Abstract JP3210322.
Abstract JP60099117.
Abstract JP4059862.
Mogi et al, *Development of High–Reliability Epoxy Molding Compounds for Surface–Mount Devices*, Proc.–Electron. Compon. Technol. Conf., vol. 42, pp. 1023–1029, 1992.

CA118:103377n "Epoxide Advancements . . . ", Guthrie, J. T. et al.

*Primary Examiner*—Frederick Krass
*Attorney, Agent, or Firm*—Browdy and Neimark

[57] ABSTRACT

Disclosed is an epoxy resin composition for sealing semiconductors which comprises as essential components: (A) an epoxy resin containing a biphenyl type epoxy resin represented by the following formula (1) in an amount of 30–100% by weight on the basis of the total amount of the epoxy resin,

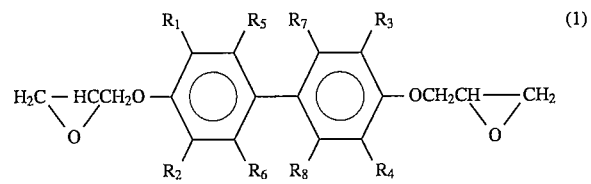
(1)

wherein $R_1$–$R_8$ are the same or different atoms or groups selected from hydrogen, halogens and alkyl groups, (B) a hardener containing a phenolic resin hardener represented by the following formula (2a) or a naphthol resin hardener represented by the following formula (2b) in an amount of 30–100% by weight on the basis of the total amount of the hardener,

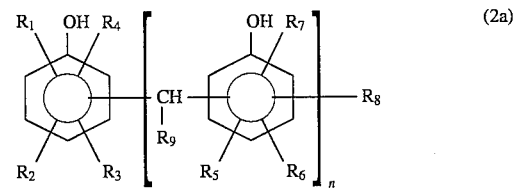
(2a)

wherein $R_1$–$R_8$ are the same or different atoms or groups selected from hydrogen, halogens and alkyl groups, $R_9$ is a group selected from phenyl, naphthyl, anthracenyl and alkyl groups, and n is 1–6,

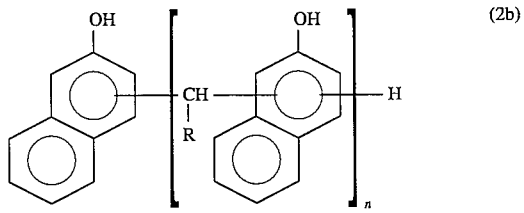
(2b)

wherein R is a group selected from phenyl, naphthyl, anthracenyl and alkyl groups, and n is 1–6, (C) an inorganic filler, and (D) a hardening accelerator.

13 Claims, No Drawings

EPOXY RESIN COMPOSITION

This application is a continuation of application Ser. No. 08/067,611, filed May 27, 1993 now abandoned.

The present invention relates to epoxy resin compositions for sealing semiconductors which are excellent in soldering stress resistance in surface mounting of semiconductor devices.

Hitherto, electronic parts such as diodes, transistors and integrated circuits have been sealed with thermosetting resins. Especially, for sealing of integrated circuits, there have been used epoxy resin compositions prepared by hardening o-cresol novolak epoxy resins excellent in heat resistance and moisture resistance with novolak type phenolic resins. However, with recent increases in integration density of integrated circuits, use of large chips has gradually increased and the packages have been changed from the conventional DIP type to surface mounted small and thin QFP, SOP, SOJ and PLCC types.

That is, large chips are sealed in a small and thin package and in this case, the stress causes formation of cracks and these cracks result in serious problems such as reduction of moisture resistance. Especially, the package is abruptly exposed to high temperatures of higher than 200° C. at the soldering step and this brings about the above problems. Thus, development of resin compositions which are suitable for sealing large chips and are high in reliability, has been desired.

As epoxy resins for solving the above problems, use of epoxy resins represented by the following formula (1) was proposed [cf. Japanese Patent Kokai (Laid-Open) No. 64-65116].

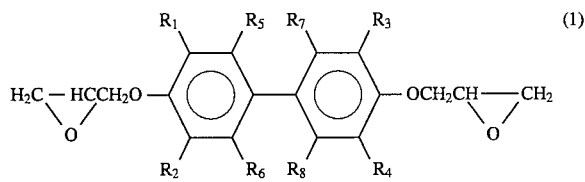

wherein $R_1$–$R_8$ are the same or different atoms or groups selected from hydrogen, halogens and alkyl groups.

By using the epoxy resins represented by the formula (1), the viscosity of the resin composition is reduced, and accordingly, improved soldering stress resistance is attained by reducing the thermal expansion and water absorption of the composition after molding by further increasing the amount of fused silica powders added to the composition. However, the increase of modulus resulting from increase in the amount of fused silica powders is also one problem, and further improvement of the soldering stress resistance is needed.

The object of the present invention is to overcome such problems, that is, to provide an epoxy resin composition used for sealing of semiconductors which is markedly improved in soldering stress resistance when used for semiconductor packages in mounting on substrates by utilizing synergistic effects of reduction in water absorption and in linear expansion attained using the epoxy resin represented by the formula (1) and reduction in water absorption and imparting of flexibility attained using a specific hardener.

The epoxy resin composition of the present invention is an epoxy resin composition for sealing semiconductors which contains as essential components:

(A) an epoxy resin containing a biphenyl type epoxy resin represented by the following formula (1) in an amount of 30–100% by weight on the basis of the total amount of the epoxy resin,

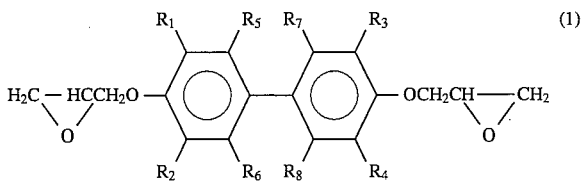

wherein $R_1$–$R_8$ are the same or different atoms or groups selected from hydrogen, halogens and alkyl groups, (B) a hardener containing a phenolic resin hardener represented by the following formula (2a) or a naphthol resin hardener represented by the following formula (2b) in an amount of 30–100% by weight on the basis of the total amount of the hardener,

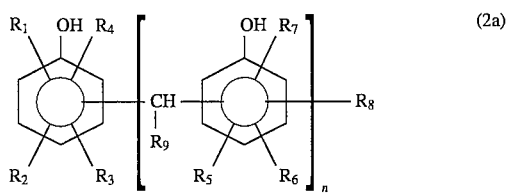

wherein $R_1$–$R_8$ are the same or different atoms or groups selected from hydrogen, halogens and alkyl groups, $R_9$ is a group selected from phenyl, naphthyl, anthracenyl and alkyl groups and n is 1–6,

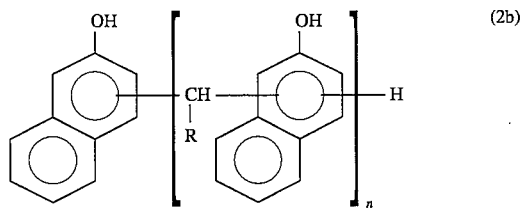

wherein R is a group selected from phenyl, naphthyl, anthracenyl and alkyl groups and n is 1–6, (C) an inorganic filler, and (D) a hardening accelerator.

The epoxy resin composition of the present invention is markedly superior to the conventional epoxy resin compositions in the soldering heat resistance.

The epoxy resin represented by the structure of the formula (1) is a bifunctional epoxy resin having two epoxy groups in one molecule and is lower in melt viscosity and superior in fluidity at transfer molding as compared with the conventional polyfunctional epoxy resins. Therefore, fused silica powders can be added in a large amount to the composition and decrease in thermal expansion and water absorption can be attained and thus, epoxy resin compositions excellent in soldering stress resistance can be obtained.

The soldering stress resistance can be improved by adjusting the amount of the epoxy resin used. In order to obtain the effect to improve the soldering stress resistance, it is desired to use the biphenyl type epoxy resin represented by the formula (1) in an amount of 30% by weight or more, preferably 60% by weight or more on the basis of the total amount of the epoxy resin. If the amount is less than 30% by weight, decrease in thermal expansion and water absorption cannot be attained and the soldering stress resistance is insufficient. Furthermore, $R_1$–$R_4$ in the formula are preferably methyl groups and $R_5$–$R_8$ are preferably hydrogen atoms.

When other epoxy resins are used in combination with the epoxy resin represented by the formula (1), the other epoxy resins include the general polymers having epoxy group. Examples of them are bisphenol type epoxy resins, cresol novolak type-epoxy reins, phenol novolak type epoxy resins, trifunctional epoxy resins such as triphenol methane type epoxy resins and alkyl-modified triphenol methane type epoxy resins, and triazine ring-containing epoxy resins.

By using the hardener represented by the molecular structure of the formula (2a) or (2b), reduction in modulus and improvement of adhesion between lead frames and semiconductor chips at the soldering temperature can be attained and besides, decrease in thermal expansion and water absorption can be attained as compared with the conventional phenol novolak resin hardeners. Therefore, the hardeners used in the present invention are effective for reduction of the stress generated by thermal shock at the time of soldering and for inhibition of peeling of semiconductor chips caused by the stress.

The soldering stress resistance can be improved by adjusting the amount of the hardener represented by the formula (2a) or (2b). In order to bring about the effect of the soldering stress resistance, it is desired to use the hardener represented by the formula (2a) or (2b) in an amount of 30% or more, more preferably 60% by weight or more on the basis of the total amount of the hardener. If the amount is less than 30% by weight, decrease in water absorption and modulus and adhesion between lead frames and semiconductor chips are insufficient and improvement in soldering stress resistance cannot be expected. Furthermore, the value of n is necessary to be in the range of 1–6. If n exceeds 6, fluidity at transfer molding decreases and moldability tends to deteriorate.

Furthermore, $R_1$–$R_8$ in the formula (2a) are preferably hydrogen or methyl groups and $R_9$ is preferably naphthyl group or an alkyl group.

Especially preferably, the formula (2a) is represented by the following formula (2a-1), (2a-2) or (2a-3):

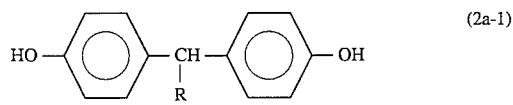

(2a-1)

wherein R is an alkyl group of 1–10 carbon atoms,

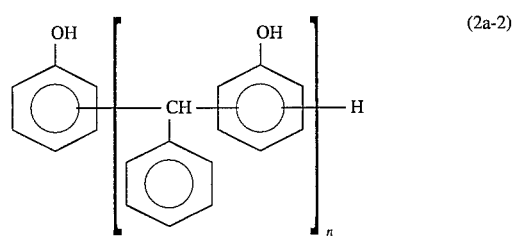

(2a-2)

wherein n is 1–6,

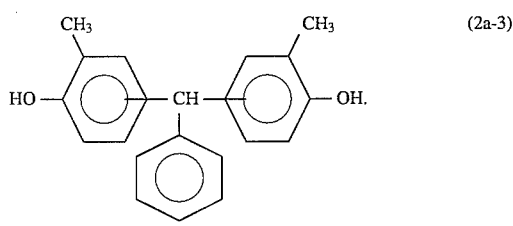

(2a-3)

The hardener represented by the molecular structure of the formula (2a-1) is a bifunctional hardener obtained by condensation reaction of phenol with a monoaldehyde obtained by substituting one hydrogen of formaldehyde with an alkyl group of 1–10 carbon atoms.

In the case of a combination of the bifunctional epoxy resin of the formula (1) with only the bifunctional phenolic hardener of the formula (2a-1), hardening is insufficient, and in order to obtain sufficient hardening, it is desirable to use a phenolic resin hardener other than the bifunctional hardener in combination with the bifunctional hardener of the formula (2a-1) which is used in an amount of 90% by weight or less.

R in the formula (2a-1) is an alkyl group of 1–10 carbon atoms, and if R is an alkyl group of 11 or more carbon atoms, fluidity at transfer molding decreases and moldability tends to deteriorate.

The hardener represented by the molecular structure of the formula (2a-2) is obtained by condensation reaction of phenol and benzaldehyde.

The hardener represented by the molecular structure of the formula (2a-3) is obtained by condensation reaction of o-cresol and benzaldehyde.

When other hardeners are used in combination with the hardener represented by the formula (2a) or (2b), such other hardeners include general polymers having mainly phenolic hydroxyl group. Examples of these hardeners are phenol novolak resins, cresol novolak resins, dicyclopentadiene-modified phenolic resins, copolymers of dicyclopentadiene-modified phenolic resins and phenol novolak resins or cresol novolak resins, terpene-modified phenolic resins, p-xylene-modified phenolic resins and naphthol resins.

The inorganic fillers used in the present invention include, for example, fused silica powders, spherical silica powders, crystalline silica powders, secondary agglomerate silica powders, porous silica powders, silica powders obtained by grinding secondary agglomerate silica powders or porous silica powders and alumina. Especially preferred are fused silica powders, spherical silica powders and mixtures of fused silica powders and spherical silica powders. The amount of the inorganic filler is preferably 70–90% by weight based on the total amount of the composition from the point of balancing between soldering stress resistance and moldability.

The hardening accelerators used in the present invention may be any of those which accelerate reaction of epoxy group and hydroxyl group, and various accelerators which are generally used in sealing materials can be used. Examples thereof are diazabicycloundecene (DBU), triphenylphosphine (TPP), dimethylbenzylamine (BDMA) and 2-methylimidazole (2 MZ). These may be used each alone or in combination of two or more.

The epoxy resin composition for sealing of the present invention comprises the epoxy resin, the hardener, the inorganic filler and the hardening accelerator as essential components. Furthermore, there may be optionally added various additives, for example, silane coupling agents, flame retardants such as brominated epoxy resins, antimony trioxide and hexabromobenzene, colorants such as carbon black and red iron oxide, releasing agents such as natural wax and synthetic wax, and low stress additives such as silicone oil and rubbers.

Molding materials can be prepared from the epoxy resin composition of the present invention by sufficiently uniformly mixing the epoxy resin, the hardener, the inorganic filler, the hardening accelerator and other additives by a mixer or the like, then further melt-kneading the mixture by hot rolls, kneader or the like, cooling the kneaded mixture and then grinding the mixture.

According to the present invention, epoxy resin compositions having soldering stress resistance which have not been able to be obtained by the conventional methods can be obtained and thus the resin compositions are considerably excellent in crack resistance when they undergo hot stress due to abrupt temperature change at soldering step and furthermore are superior in moisture resistance. Therefore, when the compositions are used for sealing, coating or insulating of electronic and electric parts, they are especially suitable for articles such as highly integrated large chip IC mounted on a surface mounting package which require very high reliability.

The following examples illustrate the present invention.

EXAMPLE 1

The following components were mixed at room temperature by a mixer, kneaded at 70°–100° C. by a twin roll, cooled and ground to obtain a molding material.

| | |
|---|---|
| Epoxy resin (softening point 110° C., epoxy equivalent 190 g/eq) represented by the formula (1a) | 3.8 parts by weight |

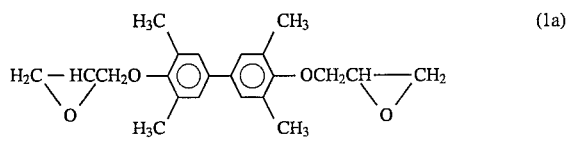

(1a)

| | |
|---|---|
| o-Cresol novolak epoxy resin (softening point 65° C., epoxy equivalent 200 g/eq) | 8.7 parts by weight |
| Hardener (softening point 118° C., hydroxyl equivalent 180 g/eq) represented by the formula (2a-4) | 2.3 parts by weight |

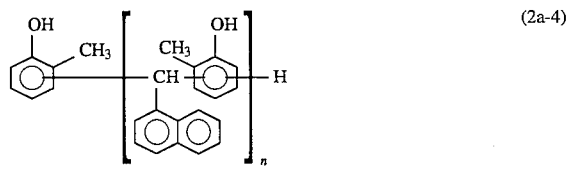

(2a-4)

(a mixture comprising the compounds shown by n of 1–6 wherein the weight ratio is 1 of n = 1, 0.2 of n = 2, 0.1 of n = 3 and 0.1 of n = 4–6)

| | |
|---|---|
| Phenol novolak resin hardener (softening point 90° C., hydroxyl equivalent 104 g/eq) | 5.2 parts by weight |
| Fused silica powders | 78.8 parts by weight |
| Triphenylphosphine | 0.2 part by weight |
| Carbon black | 0.5 part by weight |
| Carnauba wax | 0.5 part by weight |

The resulting molding material was shaped into tablets and chips of 6×6 mm were sealed in a 52 p package by a low-pressure transfer molding machine under the conditions of 175° C., 70 kg/cm$^2$, 120 seconds for soldering crack resistance test, and chips of 3×6 mm were sealed in a 16 p SOP package for soldering moisture resistance test. The sealed devices for testing were subjected to the following soldering crack resistance test and soldering moisture resistance test.

Soldering crack resistance test: The sealed devices for test were exposed to an atmosphere of 85° C., 85% RH for 48 hours and 72 hours and then dipped in a bath of solder of 260° C. for 10 seconds. Thereafter, external cracks were observed by a microscope.

Soldering moisture resistance test: The sealed devices for test were exposed to an atmosphere of 85° C., 85% RH for 72 hours and then dipped in a bath of solder of 260° C. for 10 seconds. Thereafter, they were subjected to pressure cooker test (125° C., 100% RH) and failure in opening of the circuit was measured.

The test results are shown in Table 1.

EXAMPLE 2–5

The components were mixed in accordance with the formulations of Table 1 and molding materials were prepared in the same manner as in Example 1. Molded products for test were prepared by sealing with the resulting molding materials. These molded products were subjected to the soldering crack resistance test and the soldering moisture resistance test in the same manner as in Example 1. The results are shown in Table 1.

Comparative Examples 1–4

The components were mixed in accordance with the formulations of Table 1 and molding materials were prepared in the same manner as in Example 1. Molded products for test were prepared by sealing with the resulting molding materials. These molded products were subjected to the soldering crack resistance test and the soldering moisture resistance test in the same manner as in Example 1. The results are shown in Table 1.

EXAMPLE 6

The following components were mixed at room temperature, kneaded at 70°–100° C. by a twin roll, cooled and ground to obtain a molding material.

| | |
|---|---|
| Epoxy resin (softening point 110° C., epoxy equivalent 190 g/eq) represented by the formula (1a) | 4.4 parts by weight |

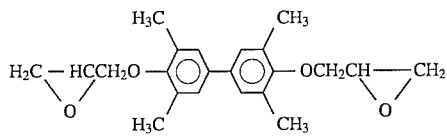  (1a)

| | |
|---|---|
| o-Cresol novolak epoxy resin (softening point 65° C., epoxy equivalent 200 g/eq) | 8.1 parts by weight |
| Hardener (softening point 110° C., hydroxyl equivalent 155 g/eq) represented by the formula (2a-2) | 2.6 parts by weight |

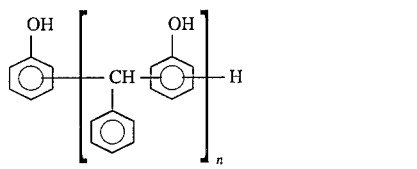  (2a-2)

(a mixture comprising the compounds shown by n of 1–4 wherein the weight ratio is 1 of n = 1, 1.5 of n = 2, 0.5 of n = 3 and 0.1 of n = 4)

| | |
|---|---|
| Phenol novolak resin hardener (softening point 90° C., hydroxyl equivalent 104 g/eq) | 4.9 parts by weight |
| Fused silica powders | 78.8 parts by weight |
| Triphenylphosphine | 0.2 part by weight |
| Carbon black | 0.5 part by weight |
| Carnauba wax | 0.5 part by weight |

(a mixture comprising the compounds shown by n of 1–4 wherein the weight ratio is 1 of n=1, 1.5 of n=2, 0.5 of n=3 and 0.1 of n=4)

| | |
|---|---|
| Phenol novolak resin hardener (softening point 90° C., hydroxyl equivalent 104 g/eq) | 4.9 parts by weight |
| Fused silica powders | 78.8 parts by weight |
| Triphenylphospine | 0.2 part by weight |
| Carbon black | 0.5 part by weight |
| Carnauba wax | 0.5 part by weight |

Samples for testing were prepared using the resulting molding material and were tested in the same manner as in Example 1. The test results are shown in Table 2.

EXAMPLE 7–10

The components were mixed in accordance with the formulations of Table 2 and molding materials were prepared in the same manner as in Example 6. Molded products for test were prepared by sealing with the resulting molding materials. These molded products were subjected to the soldering crack resistance test and the soldering moisture resistance test in the same manner as in Example 6. The results are shown in Table 2.

Comparative Examples 5–7

The components were mixed in accordance with the formulations of Table 2 and molding materials were prepared in the same manner as in Example 6. Molded products for test were prepared by sealing with the resulting molding materials. These molded products were subjected to the soldering crack resistance test and the soldering moisture resistance test in the same manner as in Example 6. The results are shown in Table 2.

TABLE 1

| | Example | | | | | Comparative Example | | | |
|---|---|---|---|---|---|---|---|---|---|
| | 1 | 2 | 3 | 4 | 5 | 1 | 2 | 3 | 4 |
| Epoxy resin of the formula (1a) | 3.8 | 10.2 | 11.3 | 7.3 | 7.0 | 2.6 | 12.4 | 3.1 | 0 |
| o-Cresol novolak epoxy resin | 8.7 | 0 | 0 | 3.1 | 4.6 | 7.9 | 0 | 9.4 | 13.2 |
| Hardener of the formula (2a-4) | 2.3 | 9.8 | 6.2 | 9.6 | 5.1 | 9.5 | 1.9 | 1.8 | 0 |
| Phenol novolak resin hardener | 5.2 | 0 | 2.5 | 0 | 3.3 | 0 | 5.7 | 5.7 | 6.8 |
| Fused silica powder | | | | | 78.8 | | | | |
| Triphenylphosphine | | | | | 0.2 | | | | |
| Carbon black | | | | | 0.5 | | | | |
| Carnauba wax | | | | | 0.5 | | | | |

TABLE 1-continued

| | Example | | | | | Comparative Example | | | |
|---|---|---|---|---|---|---|---|---|---|
| | 1 | 2 | 3 | 4 | 5 | 1 | 2 | 3 | 4 |
| Soldering crack resistance test (The number of samples having cracks/the total number of samples) | | | | | | | | | |
| Moisture absorption 48 Hr | 0/16 | 0/16 | 0/16 | 0/16 | 0/16 | 1/16 | 0/16 | 5/16 | 16/16 |
| Moisture absorption 72 Hr | 0/16 | 0/16 | 0/16 | 0/16 | 1/16 | 7/16 | 4/16 | 14/16 | 16/16 |
| Average life in soldering moisture resistance test (Hr) | >500 | >500 | >500 | >500 | >500 | 400 | 350 | 300 | 200 |

TABLE 2

| | Example | | | | | Comparative Example | | |
|---|---|---|---|---|---|---|---|---|
| | 6 | 7 | 8 | 9 | 10 | 5 | 6 | 7 |
| Epoxy resin of the formula (1a) | 4.4 | 11.0 | 12.4 | 3.9 | 7.2 | 2.8 | 12.5 | 3.1 |
| o-Cresol novolak epoxy resin | 8.1 | 0 | 0 | 7.3 | 4.8 | 8.4 | 0 | 9.5 |
| Hardener of the formula (2a-2) | 2.6 | 9.0 | 2.7 | 8.8 | 4.8 | 8.8 | 1.8 | 1.8 |
| Phenol novolak resin hardener | 4.9 | 0 | 4.9 | 0 | 3.2 | 0 | 5.7 | 5.6 |
| Fused silica powder | | | | | 78.8 | | | |
| Triphenylphosphine | | | | | 0.2 | | | |
| Carbon black | | | | | 0.5 | | | |
| Carnauba wax | | | | | 0.5 | | | |
| Soldering crack resistance test (The number of samples having cracks/the total number of samples) | | | | | | | | |
| Moisture absorption 48 Hr | 0/16 | 0/16 | 0/16 | 0/16 | 0/16 | 2/16 | 3/16 | 1/16 |
| Moisture absorption 72 Hr | 0/16 | 0/16 | 0/16 | 0/16 | 1/16 | 10/16 | 14/16 | 4/16 |
| Average life in soldering moisture resistance test (Hr) | >500 | >500 | >500 | >500 | >500 | 340 | 300 | 360 |

EXAMPLE 11

The following components were mixed at room temperature by a mixer, kneaded at 70°–100° C. by a twin roll, cooled and ground to obtain a molding material.

| | |
|---|---|
| Epoxy resin (softening point 110° C., epoxy equivalent 190 g/eq) represented by the formula (1a) | 10.3 parts by weight |

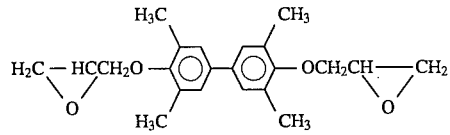

(1a)

| | |
|---|---|
| o-Cresol novolak epoxy resin (softening point 65° C., epoxy equivalent 200 g/eq) | 2.6 parts by weight |
| Phenolic resin hardener (softening point 123° C., hydroxyl equivalent 107 g/eq) represented by the formula (2a-1') | 5.7 parts by weight |

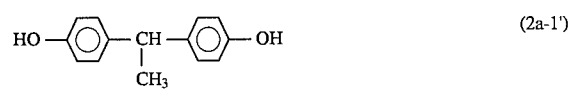

(2a-1')

| | |
|---|---|
| Phenol novolak resin hardener (softening point 90° C., hydroxyl equivalent 105 g/eq) | 1.4 parts by weight |
| Fused silica powders | 78.8 parts by weight |
| Triphenylphosphine | 0.2 part by weight |

| | 0.5 part by weight |
|---|---|
| Carbon black | 0.5 part by weight |
| Carnauba wax | 0.5 part by weight |

The resulting molding material was shaped into tablets and chips of 6×6 mm were sealed in a 52 p package by a low-pressure transfer molding machine under the conditions of 175° C., 70 kg/cm$^2$, 120 seconds for soldering crack resistance test and chips of 3×6 mm were sealed in a 16 p SOP package for soldering moisture resistance test.

The sealed devices for testing were subjected to the soldering crack resistance test and soldering moisture resistance test in the same manner as in Example 1.

The test results are shown in Table 3.

EXAMPLE 12–15

The components were mixed in accordance with the formulations of Table 3 and molding materials were prepared in the same manner as in Example 11. Molded products for test were prepared by sealing with the resulting molding materials. These molded products were subjected to the soldering crack resistance test and the soldering moisture resistance test in the same manner as in Example 1. The results are shown in Table 3.

Comparative Examples 8–11

The components were mixed in accordance with the formulations of Table 3 and molding materials were prepared in the same manner as in Example 11. Molded products for test were prepared by sealing with the resulting molding materials. These molded products were subjected to the soldering crack resistance test and the soldering moisture resistance test in the same manner as in Example 1. The results are shown in Table 3.

TABLE 3

| | Example | | | | | Comparative Example | | | |
|---|---|---|---|---|---|---|---|---|---|
| | 11 | 12 | 13 | 14 | 15 | 8 | 9 | 10 | 11 |
| Epoxy resin of the formula (1a) | 12.9 | 4.5 | 6.5 | 12.9 | 4.5 | 12.9 | 3.2 | 0 | 3.2 |
| o-Cresol novolak epoxy resin | 0 | 8.4 | 6.5 | 0 | 8.4 | 0 | 9.7 | 12.9 | 9.7 |
| Phenolic resin hardener of the formula (2a-1') | 6.0 | 6.0 | 3.5 | 2.5 | 2.5 | 1.8 | 6.0 | 7.1 | 1.8 |
| Phenol novolak resin hardener | 1.1 | 1.1 | 3.5 | 4.6 | 4.6 | 5.8 | 1.1 | 0 | 5.3 |
| Fused silica powder | | | | | 78.8 | | | | |
| Triphenylphosphine | | | | | 0.2 | | | | |
| Carbon black | | | | | 0.2 | | | | |
| Carnauba wax | | | | | 0.5 | | | | |
| Soldering crack resistance test (The number of samples having cracks/the total number of samples) | | | | | | | | | |
| Moisture absorption 48 Hr | 0/16 | 0/16 | 0/16 | 0/16 | 0/16 | 1/16 | 3/16 | 8/16 | 16/16 |
| Moisture absorption 72 Hr | 0/16 | 0/16 | 0/16 | 0/16 | 1/16 | 5/16 | 8/16 | 11/16 | 16/16 |
| Average life in soldering moisture resistance test (Hr) | 500< | 500< | 500< | 500< | 500< | 280 | 350 | 300 | 100 |

EXAMPLE 16

The following components were mixed at room temperature by a mixer, kneaded at 70°–100° C. by a twin roll, cooled and ground to obtain a molding material.

| Epoxy resin (softening point 110° C., epoxy equivalent 190 g/eq) represented by the formula (1a) | 9.2 parts by weight |
|---|---|

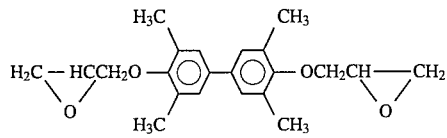

(1a)

| o-Cresol novolak epoxy resin (softening point 65° C., epoxy equivalent 200 g/eq) | 2.3 parts by weight |
|---|---|
| Phenolic resin hardener (softening point 110° C., hydroxyl equivalent 155 g/eq) represented by the formula (2a-2) | 6.8 parts by weight |

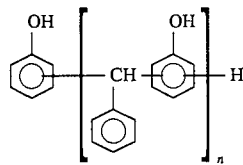

(2a-2)

(A mixture comprising the compounds shown by n of 1–4 wherein the weight ratio is 1 of n = 1, 1.5 of n = 2, 0.5 of n = 3 and 0.1 of n = 4)

| Phenol novolak resin hardener (softening point 90° C., hydroxyl equivalent 105 g/eq) | 1.7 part by weight |
|---|---|
| Fused silica powders | 78.8 parts by weight |
| Triphenylphosphine | 0.2 part by weight |
| Carbon black | 0.5 part by weight |
| Carnauba wax | 0.5 part by weight |

(A mixture comprising the compounds shown by n of 1–4 wherein the weight ratio is 1 of n=1, 1.5 of n=2, 0.5 of n=3 and 0.1 of n=4)

| Phenol novolak resin hardener (softening point 90° C., hydroxyl equivalent 105 g/eq) | 1.7 part by weight |
|---|---|
| Fused silica powders | 78.8 parts by weight |
| Triphenylphosphine | 0.2 part by weight |
| Carbon black | 0.5 part by weight |
| Carnauba wax | 0.5 part by weight |

The resulting molding material was shaped into tablets, and chips of 6×6 mm were sealed in a 52 p package by a low-pressure transfer molding machine under the conditions of 175° C., 70 kg/cm², 120 seconds for soldering crack resistance test, and chips of 3×6 mm were sealed in a 16 p SOP package for soldering moisture resistance test.

The sealed devices for testing were subjected to the soldering crack resistance test and soldering moisture resistance test in the same manner as in Example 1.

The test results are shown in Table 4.

EXAMPLE 17–20

The components were mixed in accordance with the formulations of Table 4 and molding materials were prepared in the same manner as in Example 16. Molded products for test were prepared by sealing with the resulting molding materials. These molded products were subjected to the soldering crack resistance test and the soldering moisture resistance test in the same manner as in Example 1. The results are shown in Table 4.

Comparative Examples 12–15

The components were mixed in accordance with the formulations of Table 4 and molding materials were prepared in the same manner as in Example 16. Molded products for test were prepared by sealing with the resulting molding materials. These molded products were subjected to the soldering crack resistance test and the soldering moisture resistance test in the same manner as in Example 1. The results are shown in Table 4.

TABLE 4

|  | Example | | | | | Comparative Example | | | |
|---|---|---|---|---|---|---|---|---|---|
|  | 16 | 17 | 18 | 19 | 20 | 12 | 13 | 14 | 15 |
| Epoxy resin of the formula (1a) | 9.2 | 11.0 | 12.0 | 5.6 | 6.1 | 12.9 | 0 | 2.6 | 0 |
| o-Cresol novolak epoxy resin | 2.3 | 0 | 0 | 5.6 | 6.1 | 0 | 11.3 | 10.2 | 13.1 |
| Phenolic resin hardener of the formula (2a-2) | 6.8 | 9.0 | 4.0 | 8.8 | 3.9 | 0 | 8.7 | 1.4 | 0 |
| Phenol novolak resin hardener | 1.7 | 0 | 4.0 | 0 | 3.9 | 7.1 | 0 | 5.8 | 6.9 |

TABLE 4-continued

|  | Example | | | | | Comparative Example | | | |
|---|---|---|---|---|---|---|---|---|---|
|  | 16 | 17 | 18 | 19 | 20 | 12 | 13 | 14 | 15 |
| Fused silica powder |  |  |  |  | 78.8 |  |  |  |  |
| Triphenylphosphine |  |  |  |  | 0.2 |  |  |  |  |
| Carbon black |  |  |  |  | 0.5 |  |  |  |  |
| Carnauba wax |  |  |  |  | 0.5 |  |  |  |  |
| Soldering crack resistance test (The number of samples having cracks/the total number of samples) |  |  |  |  |  |  |  |  |  |
| Moisture absorption 48 Hr | 0/16 | 0/16 | 0/16 | 0/16 | 0/16 | 2/16 | 2/16 | 6/16 | 16/16 |
| Moisture absorption 72 Hr | 0/16 | 0/16 | 0/16 | 0/16 | 2/16 | 5/16 | 8/16 | 12/16 | 16/16 |
| Average life in soldering moisture resistance test (Hr) | 500< | 500< | 500< | 500< | 500< | 300 | 420 | 280 | 100 |

EXAMPLE 21

The following components were mixed at room temperature by a mixer, kneaded at 70°–100° C. by a twin roll, cooled and ground to obtain a molding material.

| | |
|---|---|
| Epoxy resin (softening point 110° C., epoxy equivalent 190 g/eq) represented by the formula (1a) | 9.3 parts by weight |

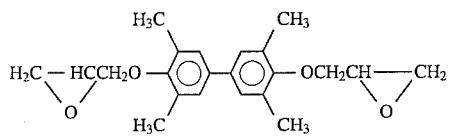

(1a)

| | |
|---|---|
| o-Cresol novolak epoxy resin (softening point 65° C., epoxy equivalent 200 g/eq) | 2.3 parts by weight |
| Phenolic resin hardener (softening point 90° C., hydroxyl equivalent 152 g/eq) represented by the formula (2a-3) | 6.7 parts by weight |

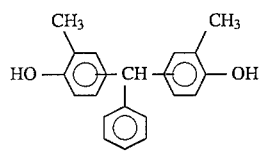

(2a-3)

| | |
|---|---|
| Phenol novolak resin hardener (softening point 90° C., hydroxyl equivalent 105 g/eq) | 1.7 part by weight |
| Fused silica powders | 78.8 parts by weight |
| Triphenylphosphine | 0.2 part by weight |
| Carbon black | 0.5 part by weight |
| Carnauba wax | 0.5 part by weight |

The resulting molding material was shaped into tablets, and chips of 6×6 mm were sealed in a 52 p package by a low-pressure transfer molding machine under the conditions of 175° C. 70 kg/cm², 120 seconds for soldering crack resistance test, and chips of 3×6 mm were sealed in a 16 p SOP package for soldering moisture resistance test.

The sealed devices for testing were subjected to the soldering crack resistance test and soldering moisture resistance test in the same manner as in Example 1.

The test results are shown in Table 5.

EXAMPLE 22–25

The components were mixed in accordance with the formulations of Table 5 and molding materials were prepared in the same manner as in Example 21. Molded products for test were prepared by sealing with the resulting molding materials. These molded products were subjected to the soldering crack resistance test and the soldering moisture resistance test in the same manner as in Example 1. The results are shown in Table 5.

Comparative Examples 16–19

The components were mixed in accordance with the formulations of Table 5 and molding materials were prepared in the same manner as in Example 21. Molded products for test were prepared by sealing with the resulting molding materials. These molded products were subjected to the soldering crack resistance test and the soldering moisture resistance test in the same manner as in Example 1. The results are shown in Table 5.

TABLE 5

|  | Example | | | | | Comparative Example | | | |
|---|---|---|---|---|---|---|---|---|---|
|  | 21 | 22 | 23 | 24 | 25 | 16 | 17 | 18 | 19 |
| Epoxy resin of the formula (1a) | 9.3 | 8.9 | 12.0 | 5.6 | 6.1 | 12.9 | 0 | 2.6 | 0 |
| o-Cresol novolak epoxy resin | 2.3 | 2.2 | 0 | 5.6 | 6.1 | 0 | 11.4 | 10.2 | 13.1 |
| Phenolic resin hardener of the formula (2a-3) | 6.7 | 8.8 | 4.0 | 8.8 | 3.9 | 0 | 8.6 | 1.4 | 0 |
| Phenol novolak resin hardener | 1.7 | 0 | 4.0 | 0 | 3.9 | 7.1 | 0 | 5.8 | 6.9 |
| Fused silica powder |  |  |  |  | 78.8 |  |  |  |  |
| Triphenylphosphine |  |  |  |  | 0.2 |  |  |  |  |
| Carbon black |  |  |  |  | 0.5 |  |  |  |  |
| Carnauba wax |  |  |  |  | 0.5 |  |  |  |  |
| Soldering crack resistance test (The number of samples having cracks/the total number of samples) |  |  |  |  |  |  |  |  |  |
| Moisture absorption 48 Hr | 0/16 | 0/16 | 0/16 | 0/16 | 0/16 | 2/16 | 1/16 | 8/16 | 16/16 |
| Moisture absorption 72 Hr | 0/16 | 0/16 | 0/16 | 0/16 | 0/16 | 7/16 | 8/16 | 14/16 | 16/16 |
| Average life in soldering moisture resistance test (Hr) | 500< | 500< | 500< | 500< | 500< | 300 | 350 | 320 | 100 |

EXAMPLE 26

The following components were mixed at room temperature by a mixer, kneaded at 70°–100° C. by a twin roll, cooled and ground to obtain a molding material.

| Epoxy resin (softening point 110° C., epoxy equivalent 190 g/eq) represented by the formula (1a) | 6.8 parts by weight |

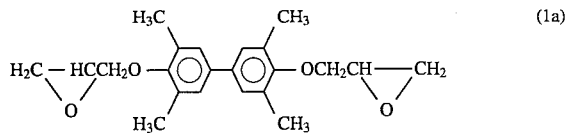

(1a)

| o-Cresol novolak epoxy resin (softening point 65° C., epoxy equivalent 200 g/eq) | 4.5 parts by weight |
| Hardener (softening point 114° C., hydroxyl equivalent 216 g/eq) represented by the formula (2b-1) | 5.3 parts by weight |

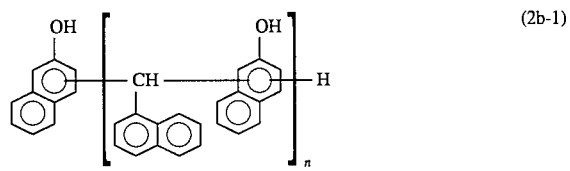

(2b-1)

(a mixture comprising the compounds shown by n of 1–4 where the weight ratio is 1 of n=1, 0.2 of n=2 and 0.1 of n=3 or more)

| Phenol novolak resin hardener (softening point 90° C., hydroxyl equivalent 105 g/eq) | 3.4 part by weight |
| Fused silica powders | 78.8 parts by weight |
| Triphenylphosphine | 0.2 part by weight |
| Carbon black | 0.5 part by weight |
| Carnauba wax | 0.5 part by weight |

The resulting molding material was shaped into tablets, and chips of 6×6 mm were sealed in a 52 p package by a low-pressure transfer molding machine under the conditions of 175° C., 70 kg/cm², 120 seconds for soldering crack resistance test and chips of 3×6 mm were sealed in a 16 p SOP package for soldering moisture resistance test.

The sealed devices for testing were subjected to the soldering crack resistance test and soldering moisture resistance test in the same manner as in Example 1.

The test results are shown in Table 6.

EXAMPLE 27–30

The components were mixed in accordance with the formulations of Table 6 and molding materials were prepared in the same manner as in Example 26. Molded products for test were prepared by sealing with the resulting molding materials. These molded products were subjected to the soldering crack resistance test and the soldering moisture resistance test in the same manner as in Example 1. The results are shown in Table 6.

Comparative Examples 20–23

The components were mixed in accordance with the formulations of Table 6 and molding materials were prepared in the same manner as in Example 26. Molded products for test were prepared by sealing with the resulting molding materials. These molded products were subjected to the soldering crack resistance test and the soldering moisture resistance test in the same manner as in Example 1. The results are shown in Table 6.

EXAMPLE 31

The following components were mixed at room temperature by a mixer, kneaded at 70°–100° C. by a twin roll, cooled and ground to obtain a molding material.

EXAMPLE 32–35

The components were mixed in accordance with the formulations of Table 7 and molding materials were prepared in the same manner as in Example 31. Molded products for test were prepared by sealing with the resulting molding materials. These molded products were subjected to the soldering crack resistance test and the soldering moisture resistance test in the same manner as in Example 1. The results are shown in Table 7.

Comparative Examples 24–26

The components were mixed in accordance with the formulations of Table 7 and molding materials were prepared in the same manner as in Example 31. Molded products for test were prepared by sealing with the resulting molding materials. These molded products were subjected to the soldering crack resistance test and the soldering moisture resistance test in the same manner as in Example 1. The results are shown in Table 7.

| Component | Amount |
|---|---|
| Epoxy resin (softening point 110° C., epoxy equivalent 190 g/eq) represented by the formula (1a) | 3.8 parts by weight |

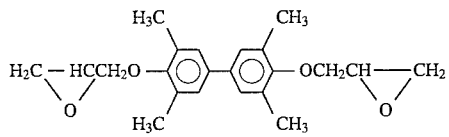

(1a)

| Component | Amount |
|---|---|
| o-Cresol novolak epoxy resin (softening point 65° C., epoxy equivalent 200 g/eq) | 8.6 parts by weight |
| Hardener (softening point 109° C., hydroxyl equivalent 200 g/eq) represented by the formula (2b-2) | 2.3 parts by weight |

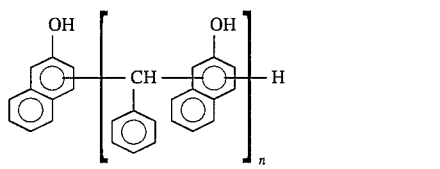

(2b-2)

(a mixture comprising the compounds shown by n of 1–4 wherein the weight ratio is 1 of n = 1, 0.2 of n = 2, 0.1 of n = 3 or more)

| Component | Amount |
|---|---|
| Phenol novolak resin hardener (softening point 90° C., hydroxyl equivalent 104 g/eq) | 5.3 parts by weight |
| Fused silica powders | 78.8 parts by weight |
| Triphenylphosphine | 0.2 part by weight |
| Carbon black | 0.5 part by weight |
| Carnauba wax | 0.5 part by weight |

Samples for the tests were prepared using the resulting molding materials in the same manner as in Example 26 and subjected to the tests in the same manner as in Example 1.

The test results are shown in Table 7.

TABLE 6

| | Example | | | | | Comparative Example | | | |
|---|---|---|---|---|---|---|---|---|---|
| | 26 | 27 | 28 | 29 | 30 | 20 | 21 | 22 | 23 |
| Epoxy resin of the formula (1a) | 6.8 | 9.4 | 12.1 | 2.9 | 3.7 | 2.3 | 12.3 | 3.1 | 0 |
| o-Cresol novolak epoxy resin | 4.5 | 0 | 0 | 6.6 | 8.6 | 7.2 | 0 | 9.3 | 13.2 |
| Hardener of the formula (2b-1) | 5.3 | 10.6 | 2.4 | 10.5 | 2.4 | 10.5 | 1.9 | 1.9 | 0 |
| Phenol novolak resin hardener | 3.4 | 0 | 5.5 | 0 | 5.3 | 0 | 5.8 | 5.7 | 6.8 |
| Fused silica powder | | | | | 78.8 | | | | |
| Triphenylphosphine | | | | | 0.2 | | | | |
| Carbon black | | | | | 0.5 | | | | |
| Carnauba wax | | | | | 0.5 | | | | |

TABLE 6-continued

| | Example | | | | | Comparative Example | | | |
|---|---|---|---|---|---|---|---|---|---|
| | 26 | 27 | 28 | 29 | 30 | 20 | 21 | 22 | 23 |
| Soldering crack resistance test (The number of samples having cracks/the total number of samples) | | | | | | | | | |
| Moisture absorption 48 Hr | 0/16 | 0/16 | 0/16 | 0/16 | 0/16 | 3/16 | 2/16 | 7/16 | 16/16 |
| Moisture absorption 72 Hr | 0/16 | 0/16 | 0/16 | 0/16 | 1/16 | 7/16 | 7/16 | 12/16 | 16/16 |
| Average life in soldering moisture resistance test (Hr) | >500 | >500 | >500 | >500 | >500 | 400 | 350 | 300 | 200 |

TABLE 7

| | Example | | | | | Comparative Example | | |
|---|---|---|---|---|---|---|---|---|
| | 31 | 32 | 33 | 34 | 35 | 24 | 25 | 26 |
| Epoxy resin of the formula (1a) | 3.8 | 9.7 | 12.1 | 3.0 | 6.9 | 2.4 | 12.3 | 3.1 |
| o-Cresol novolak epoxy resin | 8.6 | 0 | 0 | 6.9 | 4.5 | 7.5 | 0 | 9.4 |
| Hardener of the formula (2b-2) | 2.3 | 10.3 | 2.4 | 10.1 | 5.2 | 10.1 | 1.9 | 1.8 |
| Phenol novolak resin hardener | 5.3 | 0 | 5.5 | 0 | 3.4 | 0 | 5.8 | 5.7 |
| Fused silica powder | | | | 78.8 | | | | |
| Triphenylphosphine | | | | 0.2 | | | | |
| Carbon black | | | | 0.5 | | | | |
| Carnauba wax | | | | 0.5 | | | | |
| Soldering crack resistance test (The number of samples having cracks/the total number of samples) | | | | | | | | |
| Moisture absorption 48 Hr | 0/16 | 0/16 | 0/16 | 0/16 | 0/16 | 5/16 | 4/16 | 7/16 |
| Moisture absorption 72 Hr | 0/16 | 0/16 | 0/16 | 0/16 | 0/16 | 8/16 | 9/16 | 11/16 |
| Average life in soldering moisture resistance test (Hr) | >500 | >500 | >500 | >500 | >500 | 340 | 300 | 360 |

What is claimed is:

1. An epoxy resin composition for sealing semiconductors consisting essentially of:

(A) an epoxy resin containing (i) 100 parts by weight of an epoxy resin represented by the following formula (1):

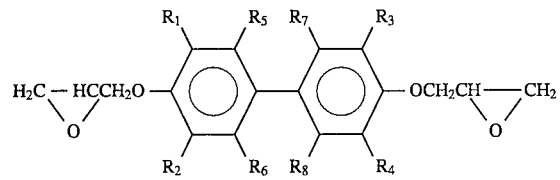

wherein $R_1$–$R_8$ are the same or different atoms or groups selected from hydrogen or alkyl groups, and (ii) 0–100 parts by weight of an o-cresol novolak epoxy resin;

(B) a hardener containing (i) 33–158 parts by weight of a phenolic resin hardener represented by the following formula (2a):

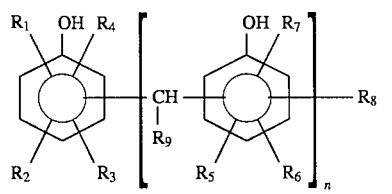

wherein $R_1$ and $R_7$ are the same or different atoms or groups selected from hydrogen, or alkyl groups, $R_2$–$R_6$ and $R_8$ are hydrogen, $R_9$ is a group selected from phenyl or methyl, and n is 1–6, (ii) and 0–64 parts by weight of a different novolak resin hardener;

(C) an amount of inorganic filler sufficient to improve soldering stress resistance; and (D) a hardening accelerator.

2. An epoxy resin composition according to claim 1, wherein the phenolic hardener (2a) is represented by the following formula (2a-1):

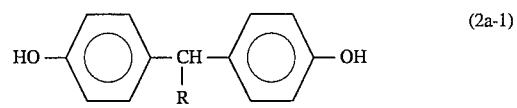

wherein R is methyl.

3. An epoxy resin composition according to claim 1, wherein the phenolic hardener (2a) is represented by the following formula (2a-2):

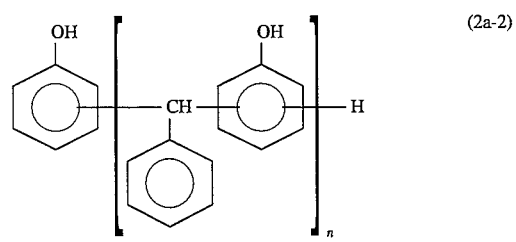

wherein n is 1–6.

4. An epoxy resin composition according to claim 1, wherein the hardener (2a) is represented by the following formula (2a-3):

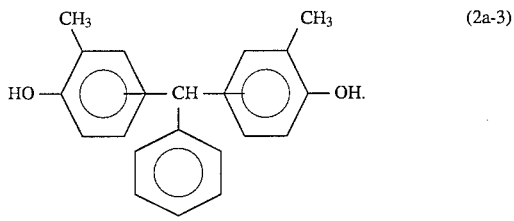

5. An epoxy resin composition according to claim 1, wherein said epoxy resin (A) contains at least 60% by weight on the basis of the total amount of epoxy resin, of the epoxy resin of formula (1) and the remainder as the o-cresol novolak epoxy resin.

6. An epoxy resin composition according to claim 1, wherein in formula (1), each of $R_1$–$R_4$ are methyl groups and each of $R_5$–$R_8$ are hydrogen atoms.

7. A composition according to claim 1, wherein said inorganic filler comprises 70–90% by weight based on the total composition.

8. An epoxy resin composition according to claim 1 wherein said phenolic resin hardener of formula (2a) comprises 100% of said hardener.

9. An epoxy resin composition according to claim 1 wherein said different novolak resin hardener is a polycondensation product of phenol and formaldehyde formed in the presence of an acid catalyst.

10. An epoxy resin composition according to claim 1 containing said o-cresol novolak epoxy resin.

11. An epoxy resin composition according to claim 10 containing said different novolak resin hardener.

12. An epoxy resin composition according to claim 1 containing said different novolak resin hardener.

13. A molded product obtained from a hardened composition consisting essentially of the components of claim 11.

* * * * *